United States Patent

Gardner et al.

Patent Number: 5,899,721
Date of Patent: May 4, 1999

[54] METHOD OF BASED SPACER FORMATION FOR ULTRA-SMALL SAPCER GEOMETRIES

[75] Inventors: Mark I. Gardner, Cedar Creek; Derrick J. Wristers, Austin, both of Tex.

[73] Assignee: Advanced Micro Devices, Inc.

[21] Appl. No.: 09/036,744

[22] Filed: Mar. 9, 1998

[51] Int. Cl.⁶ .................................................. H01L 21/336
[52] U.S. Cl. ......................... 438/303; 438/305; 438/230
[58] Field of Search .................................... 438/263, 264, 438/303, 305, 306, 361, 581, 595, 649, 691, 791, 787, 211, 218, 230, 257, 260, 261, 287, 301, 366, 583, 585, 588, 591, 692

[56] References Cited

U.S. PATENT DOCUMENTS

| | | | |
|---|---|---|---|
| 4,587,718 | 5/1986 | Haken et al. | 438/303 |
| 5,194,926 | 3/1993 | Hayden | 257/565 |
| 5,501,997 | 3/1996 | Lin et al. | 438/303 |
| 5,739,573 | 4/1998 | Kawaguchi | 257/384 |
| 5,747,373 | 5/1998 | Yu | 438/305 |
| 5,763,312 | 6/1998 | Jeng et al. | 438/303 |
| 5,770,508 | 6/1998 | Yeh et al. | 438/305 |
| 5,780,348 | 7/1998 | Lin et al. | 438/303 |

*Primary Examiner*—Charles Bowers
*Assistant Examiner*—Jack Chen
*Attorney, Agent, or Firm*—Kevin L. Daffer; Conley, Rose & Tayon

[57] ABSTRACT

A transistor and transistor fabrication method are presented wherein ultra small spacers are formed adjacent sidewall surfaces of a gate conductor. A first dielectric material is deposited over a semiconductor topography. The first dielectric is partially removed to expose a portion of the gate conductor, and a second dielectric material is deposited upon the first dielectric material and the gate conductor. The second dielectric material is anisotropically etched such that the second dielectric material is preferentially removed from substantially horizontal surfaces and retained adjacent substantially vertical surfaces. The first dielectric material is then selectively removed from areas not masked by the second dielectric material. The composite spacers thus formed adjacent sidewall surfaces of the gate conductor are thinner than spacers formed using conventional techniques. Sub-0.25-micron transistors having sidewall spacers formed by the process described herein may be less susceptible to deleterious source-side parasitic resistance than transistors having conventionally formed spacers.

11 Claims, 3 Drawing Sheets

METHOD OF BASED SPACER FORMATION FOR ULTRA-SMALL SAPCER GEOMETRIES

BACKGROUND OF THE INVENTION

1. Field of the Invention

This invention relates to integrated circuit fabrication and, more particularly, to forming transistor ultra small sidewall spacers upon sidewall surfaces of an etched polysilicon layer.

2. Description of the Related Art

Because of the increased desire to build faster and more complex integrated circuits, it has become necessary to reduce the transistor threshold voltage, $V_T$. Several factors contribute to $V_T$, one of which is the effective channel length ("$L_{eff}$") of the transistor. The initial distance between the source-side junction and the drain-side junction of a transistor is often referred to as the physical channel length, L. However, after implantation and subsequent diffusion of the junctions, the actual distance between junctions becomes less than the physical channel length and is often referred to as the effective channel length. In VLSI designs, as the physical channel length decreases, so too must $L_{eff}$. Decreasing $L_{eff}$ reduces the distance between the depletion regions associated with the source and drain of a transistor. As a result, less gate charge is required to invert the channel of a transistor having a short $L_{eff}$. Accordingly, reducing L, and hence $L_{eff}$, can lead to a reduction in the threshold voltage of a transistor. Consequently, the switching speed of the logic gates of an integrated circuit employing transistors with reduced $L_{eff}$ is faster, allowing the integrated circuit to quickly transition between logic states (i.e., operate at high frequencies). Minimizing L also improves the speed of integrated circuits including a large number of individual transistors because the larger drain current associated with a short channel length can drive the adjoining transistors into saturation more quickly. Minimizing L is, therefore, desirable from an device operation standpoint.

In addition, minimizing L is desirable from a manufacturing perspective because a smaller area of silicon is required to manufacture a transistor having a smaller length. By minimizing the area required for a given transistor, the number of transistors available for a given area of silicon increases, with a corresponding increase in the circuit complexity that can be achieved on the given area of silicon. As layout densities increase, however, the problems associated with fabrication of transistors are exacerbated. N-channel devices are particularly sensitive to so-called short-channel effects ("SCE"). SCE becomes a predominant problem whenever $L_{eff}$ drops below approximately 1.0 μm.

A problem related to SCE and the subthreshold currents associated therewith is the problem of hot-carrier effects ("HCE"). HCE is a phenomena by which the kinetic energy of the carriers (holes or electrons) is increased as they are accelerated through large potential gradients and subsequently become trapped within the gate oxide. The greatest potential gradient, often referred to as the maximum electric field ("$E_m$"), occurs near the drain during saturated operation. More specifically, the electric field is predominant at the lateral junction of the drain adjacent the channel. The electric field at the drain primarily causes electrons in the channel to gain kinetic energy and become "hot". As hot electrons travel to the drain, they lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor.

To overcome the problems of sub-threshold current and threshold shift resulting from SCE and HCI, an alternative drain structure known as lightly doped drain ("LDD") is commonly used. The purpose of the LDD is to absorb some of the potential into the drain and thus reduce $E_m$. A conventional LDD structure is one in which a light concentration of dopant is self-aligned to the gate conductor followed by a heavier dopant self-aligned to the gate conductor on which sidewall spacers have been formed. The light implant dose serves to produce a lightly doped section within the junction at the gate edge near the channel. The heavy implant dose is spaced from the channel a distance dictated by the thickness of the sidewall spacers. The heavy implant dose is the source/drain implant placed within the junction laterally outside the LDD area. As a result, a dopant gradient (i.e., "graded junction") occurs at the interface between the source and channel as well as between the drain and channel.

Unfortunately, the addition of an LDD implant adjacent the channel adds capacitance and resistance to the source/drain pathway. This added resistance, generally known as parasitic resistance, can have many deleterious effects. First, parasitic resistance can decrease the saturation current (i.e., current above threshold). Second, parasitic capacitance can decrease the overall speed of the transistor. The deleterious effects of decreased saturation current and transistor speed is best explained in reference to a transistor having conventional source and drain LDDs. Using an n-channel example, the drain resistance $R_D$ causes the gate edge near the drain to "see" a voltage, e.g., less than VDD, to which the drain is typically connected. Similarly, the source resistance $R_S$ causes the gate edge near the source to see some voltage, e.g., more than ground. The drive current along the source-drain path depends mostly on the voltage applied between the gate and source, i.e., $V_{GS}$. If $V_{GS}$ exceeds the threshold voltage $V_T$, the transistor will go into saturation according to the following relation:

$$I_{DSAT} = K/2 * (V_{GS} - V_T)^2$$

where $I_{DSAT}$ is saturation current and K is a value derived as a function of the process parameters used in producing the transistor. Reducing or eliminating $R_S$ would therefore draw the source-coupled voltage closer to ground and thereby increase the effective $V_{GS}$. From the above equation, it can be seen that increasing $V_{GS}$ directly increases $I_{DSAT}$. While it would seem beneficial to decrease $R_D$ as well, $R_D$ is nonetheless needed to maintain HCI control. Accordingly, a substantial LDD area is required in the drain area.

Proper LDD design must take into account the need for minimizing parasitic resistance $R_S$ at the source side while at the same time attenuating $E_m$ at the drain side of the channel. A well engineered LDD design is necessary to reduce HCI and SCE and to maximize the saturation current of a transistor. The thickness of the sidewall spacers employed by a transistor controls the length of the LDDs. If the spacer width and corresponding LDD length are too large, however, then parasitic resistance $R_S$ may unduly jeopardize transistor operation. This is especially true for sub-micron MOSFET structures, where spacers formed according to traditional methods may be disproportionately large compared to the length of the gate structures.

It would therefore be desirable to derive a method for fabricating a transistor having sidewall spacers with ultra small geometries. Since the lateral thicknesses of the sidewall spacers employed by a transistor determines the LDD lengths, effectively controlling spacer thickness is important. Sidewall spacers having lateral dimensions reduced over the lateral thicknesses of spacers formed by conventional methods may be useful for producing smaller LDD regions and thus minimizing parasitic resistance $R_S$ in transistors having small lateral dimensions.

SUMMARY OF THE INVENTION

The problems outlined above are in large part solved by the technique hereof for fabricating a transistor in which ultra small spacers are formed self-aligned laterally adjacent to the opposed sidewall surfaces of the gate conductor. In one embodiment, a thin layer of silicon dioxide, or gate oxide, is thermally grown across a semiconductor substrate and polysilicon is deposited across the upper surface of the gate oxide. Portions of the polysilicon are then removed using optical lithography to define a pair of opposed sidewall surfaces of a polysilicon gate conductor. In an embodiment, portions of the gate oxide may be removed commensurate with the removal of the polysilicon. In an alternative embodiment, the polysilicon may be selectively removed while substantially retaining the gate oxide layer.

A relatively light dopant concentration may then be implanted into regions of the semiconductor substrate not masked by the gate conductor. In this manner, LDD areas are formed within the semiconductor substrate self-aligned to the sidewall surfaces of the gate conductor. Subsequently, a layer of a first dielectric material may be deposited by CVD across the exposed LDD areas and the gate conductor to a thickness greater than a vertical thickness of the gate conductor. In an embodiment, the first dielectric material may be silicon dioxide ("oxide"). An upper surface of the oxide layer may then be polished using, e.g., chemical-mechanical polish ("CMP") or selective etchback, to obtain an oxide layer having a substantially planar upper surface. Preferably, the thickness of the oxide layer following polishing remains greater than the thickness of the gate conductor and therefore extends over the gate conductor. A directional plasma etch selective for oxide may then be used to uniformly reduce the height of the oxide layer without etching the polysilicon. The oxide is preferably removed to a final height of between about one-half and about two-thirds the thickness of the gate structure.

Sidewall spacers are conventionally formed adjacent gate conductors by depositing a dielectric material on the upper surface of the semiconductor substrate (FIGS. 1–2). During deposition, dielectric material preferentially accumulates adjacent sidewalls of the gate structure. As a result, the vertical thickness of the dielectric layer deposited adjacent the sidewalls of the gate structure is greater than the vertical thickness of the dielectric material deposited either upon the upper surface of the gate structure or upon regions of the semiconductor substrate laterally spaced from the gate structure. Alternatively, the dielectric layer is deposited to substantially the same thickness regardless of the underlying topography. Anisotropic etching may be used to preferentially remove dielectric material from horizontal surfaces of the semiconductor topography while retaining dielectric upon vertical surfaces. The retained material forms the sidewall spacers adjacent the gate structure.

In the method described herein, a layer of a second dielectric material may be deposited across exposed portions of the polysilicon gate conductor and the oxide layer following partial etching of the oxide layer. In an embodiment, the second dielectric material may be silicon nitride ("nitride"). Preferably, the nitride is deposited by a CVD process. An anisotropic etch highly selective for nitride may be used to selectively remove nitride from horizontal surfaces while leaving nitride that is deposited adjacent vertical surfaces of the polysilicon gate conductor. A directional plasma etch selective for oxide may then be used to remove oxide from areas not masked by the nitride. The directional plasma etch will remove thermally grown oxide not previously removed, as well as deposited oxide, to expose the upper surface of the semiconductor substrate. As a result, composite sidewall spacers consisting of a layer of nitride overlying a layer of oxide are formed immediately adjacent the gate conductor sidewall surfaces.

Following formation of the composite spacer structures, an ion implantation which is self-aligned to exposed lateral edges of the spacers may be performed to form heavily doped source/drain regions laterally spaced from the channel. A conductive material (e.g., tungsten or titanium) may be deposited upon upper surfaces of the gate structure and the source/drain regions. The presence of the spacers prevents conductive material from being deposited in regions directly laterally adjacent to the gate conductor where they could render the transistor inoperable.

The method as described herein has the advantage of forming spacers with ultra small geometries. Spacer thickness is somewhat influenced by the amount of material deposited over the semiconductor topography. That is, the more material that is deposited, the more that accumulates adjacent sidewall surfaces of the gate conductor and/or remains following selective removal to form the spacers. Conventional methods of spacer formation typically require deposition of a relatively thick layer of spacer material upon a semiconductor topography. In contrast, the present method allows for formation of a second dielectric layer upon a first dielectric layer. Because the first dielectric material covers a portion of the gate structure, less of the second dielectric material need be deposited to completely cover the gate structure. As a result, less of the second dielectric material accumulates and/or remains adjacent the exposed sidewalls of the gate conductor than would accumulate using conventional methods. Following selective removal of second dielectric material from horizontal surfaces of the semiconductor topography, the lateral thickness of the remaining spacers is reduced relative to that that of conventionally formed spacers.

Further, due to limitations in processing technology, control of the lateral thickness of the spacers formed by conventional methods is rather limited. In contrast, using the method described herein, the thickness of the first dielectric layer covering the semiconductor substrate can- be controlled fairly precisely. Consequently, the thickness of the second dielectric layer deposited upon the first layer can also be controlled. By varying the thickness of the first dielectric layer, the lateral thickness of the second dielectric material retained adjacent the gate conductor following removal can be controlled. Lightly doped drain regions thus may be formed using the method described herein such that source-side parasitic resistance is minimized in sub-micron MOSFETs.

BRIEF DESCRIPTION OF THE DRAWINGS

Other objects and advantages of the invention will become apparent upon reading the following detailed description and upon reference to the accompanying drawings in which.

Figure 1:
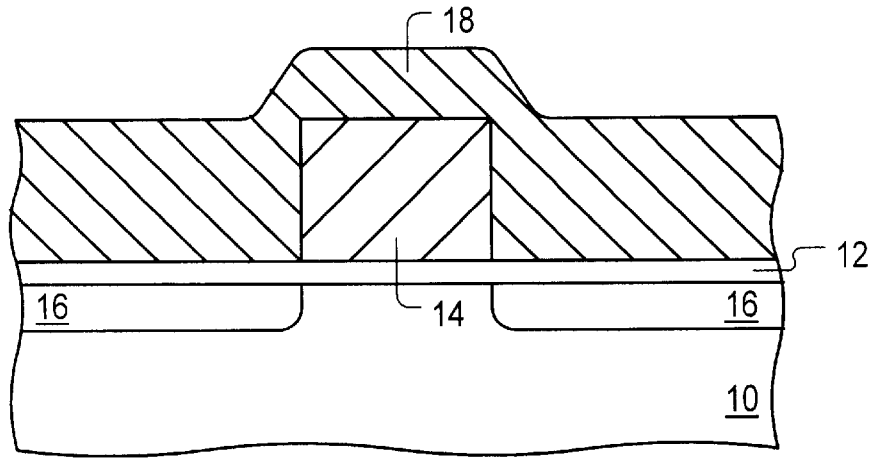
FIG. 1 is a partial cross-sectional view of a semiconductor topography formed according to the prior art, wherein a dielectric material has been deposited over a semiconductor topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Figure 2:
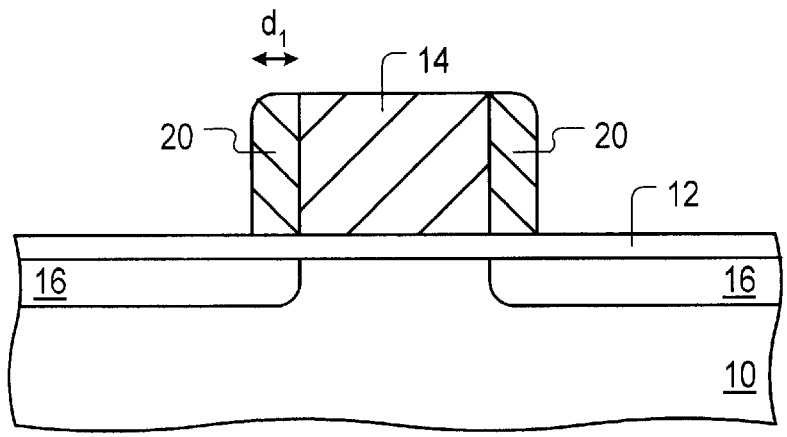
FIG. 2 is a partial cross-sectional view of the semiconductor topography according to a processing step subsequent to FIG. 1, wherein the dielectric material has been etched to form sidewall spacers.

Turning now to the drawings, FIGS. 1–2 illustrate a process by which spacers are typically formed using methods well known in the art. FIG. 1 depicts a semiconductor substrate 10 upon which a gate dielectric 12 and a gate conductor 14 have been formed. Lightly doped drain regions 16 have been implanted into semiconductor substrate 10. Dielectric material 18 is deposited across exposed surfaces of semiconductor substrate 10, gate dielectric 12, and gate conductor 14 (FIG. 1). An anisotropic etch is then used to preferentially remove dielectric material 18 from horizontal surfaces of the semiconductor topography while retaining the dielectric material on vertical surfaces (FIG. 2). The retained material forms spacers 20 adjacent sidewall surfaces of the gate structure. Spacers 20 are formed with a lateral dimension $d_1$.

Figure 3:
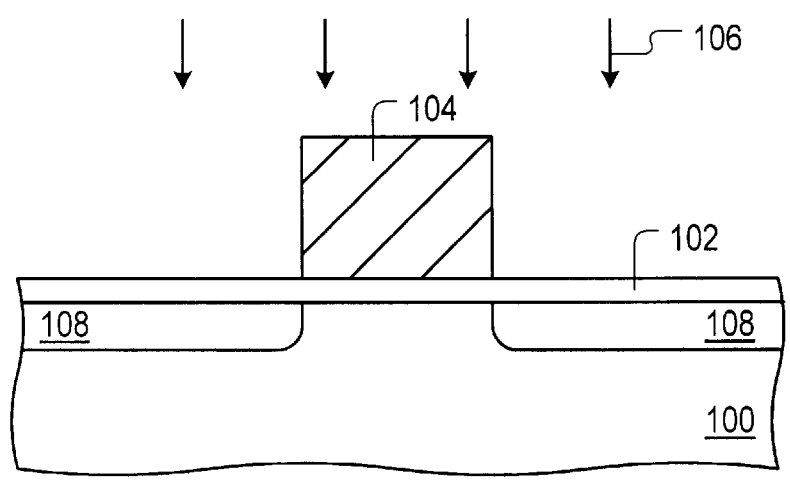
FIG. 3 is a partial cross-sectional view of a semiconductor topography having a gate conductor formed a dielectric distance above a semiconductor substrate, and LDD areas defined adjacent the gate conductor.

FIG. 3 illustrates a semiconductor substrate 100 upon which a layer 102 of silicon dioxide ("oxide") has been formed. Substrate 100 may comprise single crystalline silicon and dielectric isolation regions arranged a spaced distance apart for dielectrically isolating ensuing active areas. Preferably, substrate 100 is slightly doped with n-type or p-type impurities. Gate oxide 102 may be formed by deposition from, e.g., a silane- and oxygen-bearing source. Alternatively, the oxide may be thermally grown.

A polycrystalline silicon ("polysilicon") gate conductor 104 is arranged upon gate oxide 102. Polysilicon gate conductor 104 may be formed using chemical vapor deposition ("CVD") of polysilicon from a silane source. The opposed sidewall surfaces of polysilicon gate conductor 104 may be defined by etching portions of the polysilicon not covered by a patterned photoresist layer using, e.g., a plasma etch technique. As depicted in FIG. 3, the polysilicon has been selectively etched to form gate conductor 104 without etching the underlying gate oxide 102. Alternatively, both the polysilicon and the oxide may be etched. A lightly doped drain ("LDD") implant 106 aligned to the opposed sidewall surfaces of gate conductor 104 may then be forwarded into the exposed regions of semiconductor substrate 100. As a result, LDD areas 108 may be formed within regions of substrate 100 laterally adjacent gate conductor 104. The LDD areas 108 preferably contain a light concentration of dopants that are opposite in type to the dopants implanted within the channel region of substrate 100.

Figure 4:
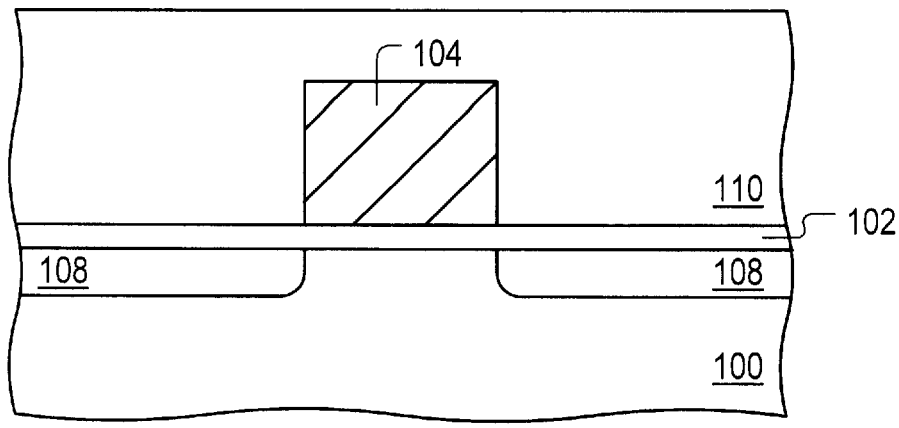
FIG. 4 is a partial cross-sectional view of the semiconductor topography according to a processing step subsequent to FIG. 3, wherein a first dielectric material is formed across the gate conductor and the semiconductor topography.

FIG. 4 illustrates the CVD of a first dielectric material across exposed surfaces of gate oxide 102 and gate conductor 104. The first dielectric material preferably comprises oxide 110 deposited from, e.g., a silane- and oxygen-bearing source. Although oxide is preferred, it is to be understood that any material dissimilar from polysilicon and which cannot accommodate a silicide thereon is an acceptable material. Oxide 110 is preferably deposited across the semiconductor topography to a depth greater than a thickness of polysilicon gate conductor 104. The upper surface of oxide 110 is preferably planarized using, e.g., a chemical-mechanical polish or an etchback technique.

Figure 5:
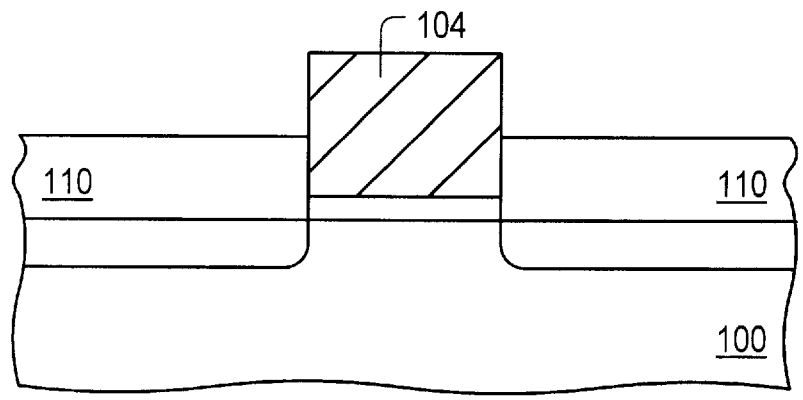
FIG. 5 is a partial cross-sectional view of the semiconductor topography according to a processing step subsequent to FIG. 4, wherein the first dielectric material is removed to a thickness less than a thickness of the gate conductor.

Following planarization, a directional plasma etch may be used to reduce the height of oxide layer 110 uniformly, as depicted in FIG. 5. The etch is preferably selective such that polysilicon gate 104 is not appreciably etched. In an embodiment, no photoresist masking is used. Oxide layer 110 is preferably etched back to a height between about one-half and two-thirds the height of gate conductor 104.

Figure 6:
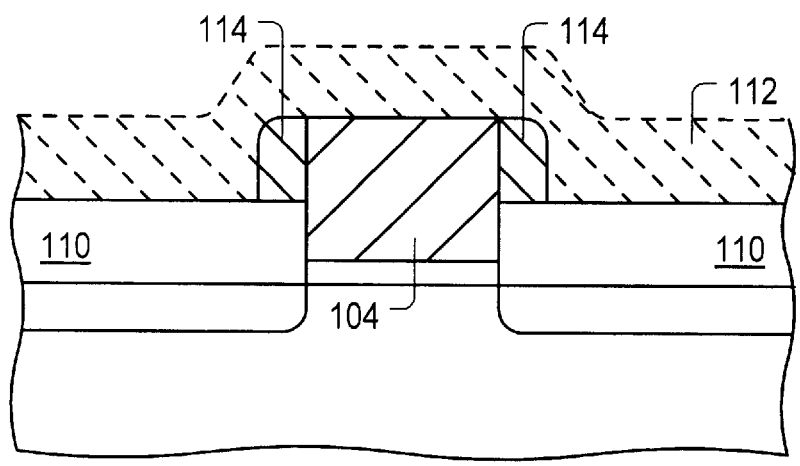
FIG. 6 is a partial cross-sectional view of the semiconductor topography according to a step subsequent to FIG. 5, wherein spacers of a second dielectric material different from the first dielectric material are formed upon portions of the first dielectric material adjacent sidewall surfaces of the gate conductor.

FIG. 6 depicts a processing step subsequent to the step of FIG. 5, in which a layer of a second dielectric material is deposited across the gate conductor and the first dielectric layer. The second dielectric material preferably comprises silicon nitride ("nitride") layer 112 deposited from, e.g., a silane- and nitrogen-bearing source. Alternatively, the second dielectric material nay be any material different from the first dielectric material. An anisotropic etch that etches in the horizontal direction faster than in the vertical direction may be used to remove nitride (shown in phantom) from above oxide layer 102 and polysilicon gate 104 while selectively retaining nitride spacers 114 on the exposed sidewall surfaces of the polysilicon.

Figure 7:
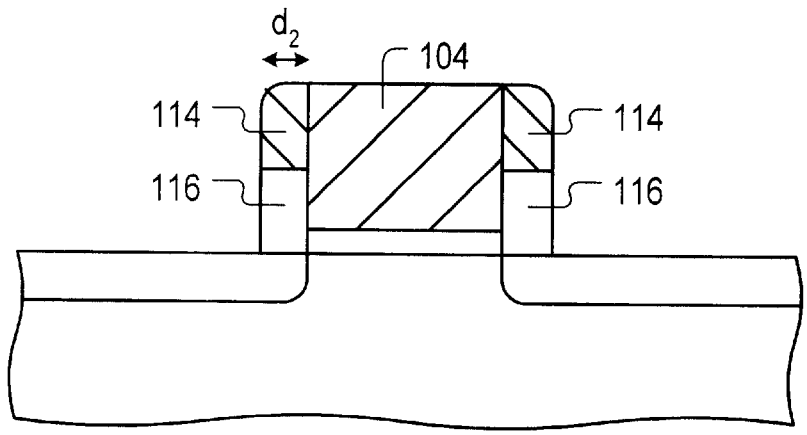
FIG. 7 is a partial cross-sectional view of the semiconductor topography according to a step subsequent to FIG. 6, wherein the first dielectric material is selectively removed from areas other than beneath the spacers formed from the second dielectric material to form ultra-small composite spacers adjacent the sidewall surfaces of the gate conductor.
Figure 8:
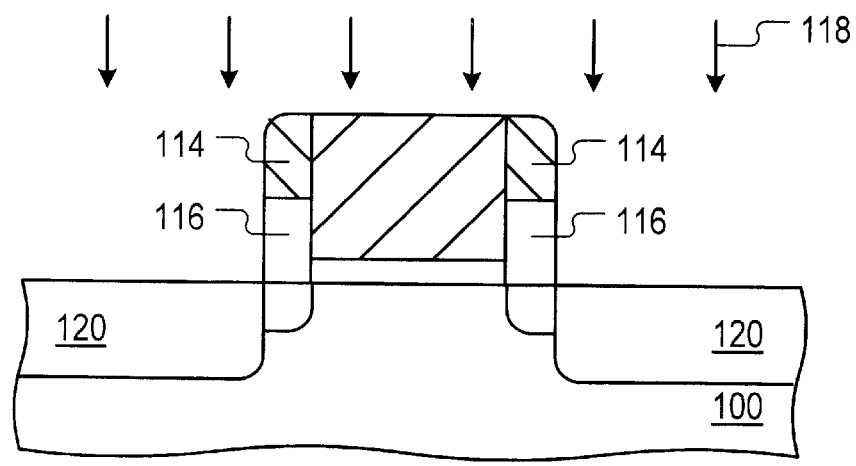
FIG. 8 is a partial cross-sectional view of the semiconductor topography according to a step subsequent to FIG. 7, wherein source and drain areas are defined a spaced distance from channel areas according to the composite spacers.

Following etching of the nitride, an anisotropic plasma etch selective for oxide is used to remove oxide from above the semiconductor substrate without etching the nitride or the polysilicon, as depicted in FIG. 7. What remains is the polysilicon gate electrode 104 with composite spacers adjacent the sidewall surfaces. The composite spacers include nitride 114 and oxide 116 and have a lateral dimension $d_2$. Lateral dimension $d_2$ is less than lateral dimension $d_1$ of spacers 20 formed by conventional methods (FIG. 2). A heavy concentration source/drain implant 118 may then be forwarded into substrate 100 a spaced distance from gate conductor 104 to form source/drain regions 120, as depicted in FIG. 8. The spacers serve to mask portions of substrate 100 from impurities.

Figure 9:
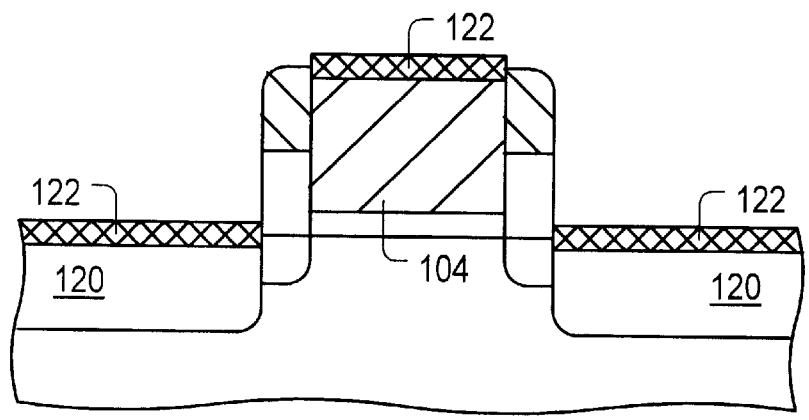
FIG. 9 is a partial cross-sectional view of the semiconductor topography according to a step subsequent to FIG. 8, wherein a metal silicide is formed on the gate conductor and source/drain upper surfaces to enhance interlevel conductivity thereto.

Following formation of source and drain areas 120, a refractory metal (e.g., titanium or cobalt) may be formed across source/drain regions 120 and the upper surface of gate conductor 104, as shown in FIG. 9. The refractory metal may be sputter deposited from a metal target such that it travels in a direction substantially perpendicular to horizontally oriented features. The deposited refractory metal may be exposed to a form of radiation capable of increasing the temperature of the refractory metal to above, e.g., 600° C. The radiation may be thermal radiation provided from a heated furnace. Alternately, the radiation may be radiant light supplied from, e.g., an arc lamp or a tungsten-halogen lamp using a technique known as rapid thermal processing ("RTP"). The use of RTP to heat the refractory metal may reduce the amount of unwanted dopant diffusion into the semiconductor topography as compared to using a high-temperature furnace. Raising the temperature of the refractory metal serves to initiate reaction between metal atoms and silicon atoms of polysilicon gate conductor 104 and source/drain regions 120. Any unreacted refractory metal which remains may be etched away using, e.g., a wet etch highly selective to the metal. The resulting metal silicide 122 has a relatively low resistivity and serves as a self-aligned contact region across source/drain regions 120 and gate conductor 104. Absent refractory metal upon the lower portions of the spacers, no silicide formation occurs at those portions. Consequently, silicide bridging between gate conductor 104 and source/drain regions 120 is less likely to occur.

It will be appreciated to those skilled in the art having the benefit of this disclosure that this invention is believed to provide a method for forming self-aligned spacers of small geometries. Further modifications and alternative embodiments of various aspects of the invention will be apparent to those skilled in the art in view of this description. For example, the methods described herein may be selectively applied only to spacers formed on the source side of the transistor, while conventional methods are used to form drain-side spacers. Such a transistor could then exhibit the dual advantages of lower source-side parasitic resistance (due to the shorter source-side LDD) and reduced hot carrier injection on the drain side (due to the longer drain-side LDD). It is intended that the following claims be interpreted to embrace all such modifications and changes and, accordingly, the specification and drawings are to be regarded in an illustrative rather than a restrictive sense.

What is claimed is:

1. A method for fabricating a transistor, comprising:

depositing a first dielectric material upon a semiconductor topography comprising a gate conductor and a substrate;

while maintaining the first dielectric material upon the substrate, partially removing the first dielectric material to expose an upper portion of the gate conductor;

depositing a second dielectric material different from the first dielectric material across exposed portions of the gate conductor and the first dielectric material; and subsequent to said depositing a second dielectric material, removing portions of the first and second dielectric materials except in regions laterally adjacent sidewall surfaces of the gate conductor.

2. The method of claim 1, further comprising forming a gate dielectric interposed between the substrate and the gate conductor.

3. The method of claim 1, further comprising forming lightly doped drain regions self-aligned with the sidewall surfaces of the gate conductor prior to depositing said first dielectric material.

4. The method of claim 1, wherein said depositing a first dielectric material comprises chemical-vapor depositing silicon dioxide from a silane source.

5. The method of claim 1, further comprising planarizing an upper surface of the first dielectric material prior to partially removing said first dielectric material.

6. The method of claim 5, wherein planarizing comprises chemical-mechanical polishing.

7. The method of claim 1, wherein partially removing the first dielectric material comprises directionally etching the first dielectric material to a vertical thickness approximately between about one-half and about two-thirds a vertical thickness of the gate conductor.

8. The method of claim 1, wherein depositing the second dielectric material comprises chemical-vapor depositing silicon nitride from a silane source.

9. The method of claim 1, wherein removing portions of the first and second dielectric materials comprises:

anisotropically etching said second dielectric material such that portions of the second dielectric material are removed from horizontal surfaces faster than from vertical surfaces; and using said second dielectric material as a mask, directionally etching portions of said first dielectric material using a plasma etch selective for the first dielectric material.

10. The method of claim 1, further comprising forming source/drain regions a spaced lateral distance from the sidewall surfaces of the gate conductor.

11. The method of claim 10, further comprising forming a metal silicide layer on upper surfaces of the gate conductor and the source/drain regions.

* * * * *

UNITED STATES PATENT AND TRADEMARK OFFICE
CERTIFICATE OF CORRECTION

PATENT NO.   : 5,899,721
DATED        : May 4, 1999
INVENTOR(S)  : Gardner, et. al.

It is certified that error appears in the above-indentified patent and that said Letters Patent is hereby corrected as shown below:

Title page, item [54] and col. 1, the title should read --
METHOD OF POLISHED SPACER FORMATION FOR ULTRA-SMALL SPACER GEOMETRIES--.

Signed and Sealed this

Sixteenth Day of November, 1999

Attest:

Q. TODD DICKINSON

Attesting Officer

Acting Commissioner of Patents and Trademarks